United States Patent [19]
Nance

[11] Patent Number: 6,028,450
[45] Date of Patent: Feb. 22, 2000

[54] PROGRAMMABLE INPUT/OUTPUT CIRCUIT WITH PULL-UP BIAS CONTROL

[75] Inventor: Scott S. Nance, Sunnyvale, Calif.

[73] Assignee: Xilinx, Inc., San Jose, Calif.

[21] Appl. No.: 09/040,497

[22] Filed: Mar. 17, 1998

[51] Int. Cl.[7] .............................................. H03K 19/0185
[52] U.S. Cl. ................................ 326/81; 326/50; 326/58; 326/83
[58] Field of Search ................................. 326/80–81, 68, 326/83, 86, 121, 49–50, 57–58

[56] References Cited

U.S. PATENT DOCUMENTS

| | | | |
|---|---|---|---|
| 5,144,165 | 9/1992 | Dhong et al. ............................... | 326/80 |
| 5,396,128 | 3/1995 | Dunning et al. ............................ | 326/57 |
| 5,764,077 | 6/1998 | Andresen et al. .......................... | 326/83 |
| 5,933,025 | 8/1999 | Nance et al. ............................... | 326/81 |

*Primary Examiner*—Jon Santamauro
*Attorney, Agent, or Firm*—Patrick T. Bever; Jeanette S. Harms

[57] ABSTRACT

A programmable input/output (I/O) circuit for transmitting output signals on or receiving input signals from an I/O terminal, the I/O circuit including a pull-up transistor, a gate bias control circuit and a well bias control circuit, all being connected between Vcc and the I/O terminal. The gate bias control circuit connects the gate of the pull-up transistor to the I/O terminal and the well bias control circuit connects the bulk terminal of the pull-up transistor to the I/O terminal when the I/O circuit is in a 5V tolerant input mode. The gate bias control circuit connects the gate of the pull-up transistor to the system voltage source and the well bias control circuit connects the bulk terminal of the pull-up transistor to Vcc when the I/O circuit is in a PCI compliant input mode. In an output mode, the gate bias control circuit and well bias control circuit allow the pull-up transistor to pull up the I/O terminal to Vcc in response to a pull-up data signal.

13 Claims, 4 Drawing Sheets

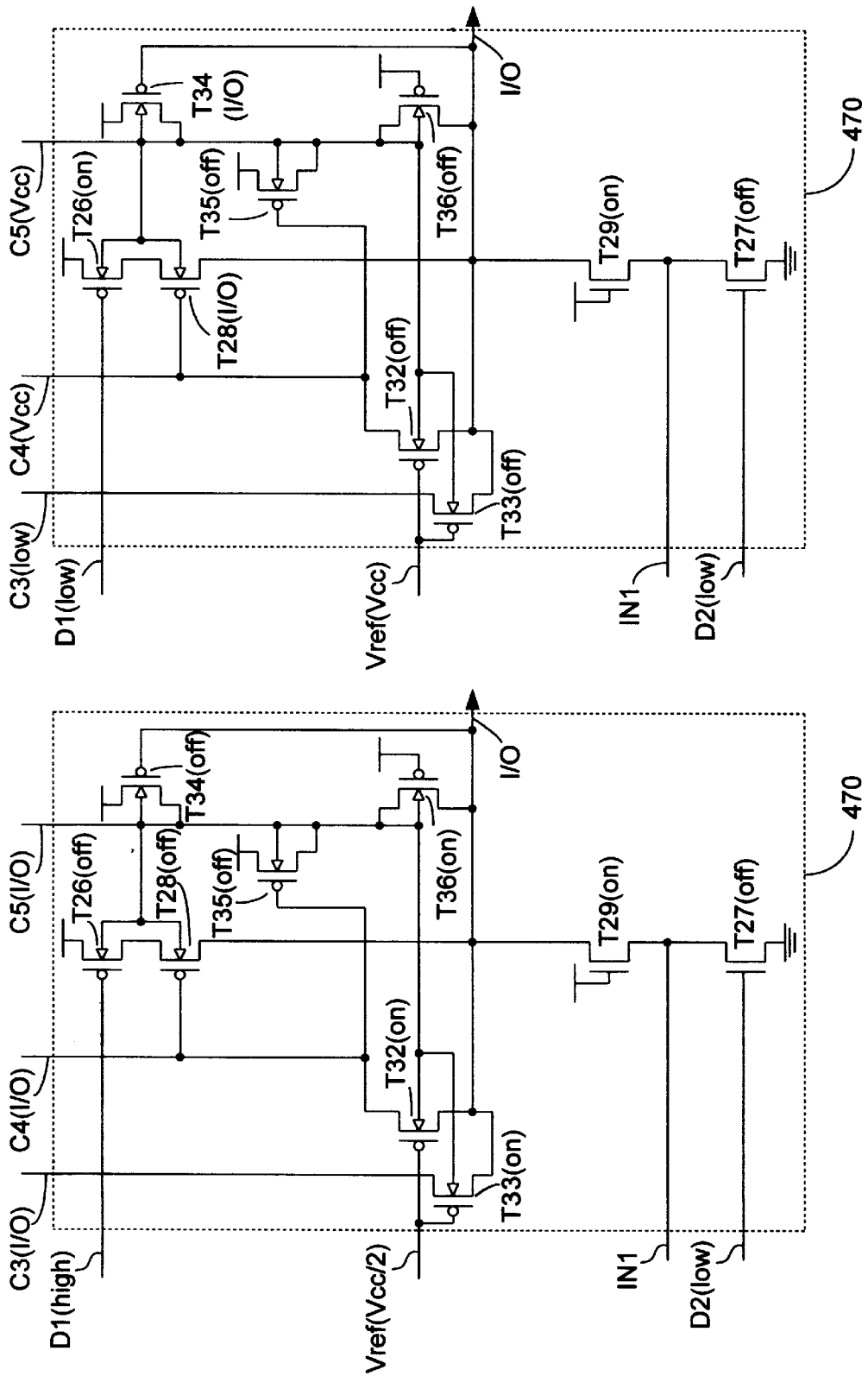

PROGRAMMABLE INPUT/OUTPUT CIRCUIT WITH PULL-UP BIAS CONTROL

FIELD OF THE INVENTION

This invention relates to the field of integrated circuits, and more specifically to digital logic input/output terminal circuits for interfacing programmable logic devices with other integrated circuit devices in systems utilizing more than one power supply level.

BACKGROUND OF THE INVENTION

Integrated circuit (IC) devices typically include numerous transistors that are fabricated on, for example, silicon wafers. For a given power supply voltage, the electric field strength, e.g., the change in voltage per unit length, that these transistors are exposed to increases as the size of the transistors is reduced. The maximum electric field tolerance can be a limiting factor on the minimum transistor size of an IC device. For example, a typical maximum gate oxide field strength for a silicon dioxide gate is about 3 megavolts per centimeter. High electric fields inside a transistor can reduce the mean time to failure, and can destroy transistors of an IC device when an electric field exceeds the breakdown value for a given material in a transistor, such as the gate oxide in CMOS devices.

Until recently, 5V supplies were typically used to power digital IC devices. Recently, there has been a trend toward the use of 3.3V supplies that allow a reduction in the minimum transistor size in certain types of digital logic IC devices, including CMOS devices. These 3.3V digital logic devices must often be connected in a system to other IC devices that operate with 5V supplies, such as, for example, TTL devices. However, without protection, the electric field generated by such 5V TTL devices would exceed the breakdown value of the gate oxide in the transistors of the 3.3V devices. Therefore, an interface circuit is generally required to isolate the electric field of the 5V TTL devices from the transistors in the 3.3V IC devices.

Programmable logic devices (PLDs) are IC devices that typically include a plurality of logic elements and associated interconnect resources that are programmed by a user to implement user-defined logic operations (that is, a user's circuit design). PLDs are programmed using a personal computer or workstation and appropriate software. Therefore, unlike application specific integrated circuits (ASICs) that require a protracted layout process and an expensive fabrication process to implement a user's logic operation, a PLD may be utilized to implement the logic operation in a relatively quick and inexpensive manner.

FIG. 1 shows a portion of a field programmable gate array (FPGA) 100, which is one type of PLD that is sold with a 3.3V supply. Although greatly simplified, FPGA 100 is generally consistent with XC3000™ series FPGAs, which are produced by Xilinx, Inc. of San Jose, Calif. FPGA 100 includes an array of configurable function blocks (FBs) 110, input/output (I/O) blocks 120 surrounding the array of FBs 110, and programmable interconnect resources that include interconnect channels 130 (indicated by dashed lines) extending between the rows and columns of FBs 110. Each FB 110 includes configurable combinational circuitry and optional output registers, and conductive wires 115 that connect (via programmable elements, not shown) to the interconnect channels 130. All of the FBs 100 of an FPGA are typically identical. I/O circuits 120 are connected between an I/O pin 140 of FPGA 100 and the interconnect channels 130. Each I/O circuit 120 is programmable to transmit input signals from an associated I/O pin 140 to a selected FB 110, or to transmit output signals from an FB 110 to the associated I/O pin 140. The interconnect channels 130 comprise discrete wire segments that are linked by programmable elements to selectively form signal paths between the FBs 110 and I/O circuits 120. Specifically, the interconnect resources are programmable to selectively provide I/O-to-FB connections, FB-to-FB connections, and FB-to-I/O connections that are associated with a user's logic operation.

FIG. 2 is a simplified diagram showing a portion of a known I/O circuit 120(1). I/O circuit 120(1) receives output signals from FBs 110 via interconnect channels 130 on a DATA OUT line. The output signal is transmitted to an output circuit 121 that generates a pull-up signal D1 and a pull-down signal D2 that are used to generate a high or a low output signal at I/O pin 140(1). The pull-up signal is applied to the gate of P-channel pull-up transistor 122, and the pull-down signal D2 is applied to the gate of N-channel pull-down transistor 123. Pull-up transistor 122 has a source connected to Vcc (e.g., 3.3 volts), and a drain connected to I/O pin 140(1). Pull-down transistor 123 has a source connected to ground, and a drain connected to I/O pin 140(1). The voltage at the N-well (body) of pull-up transistor 122 is controlled by a well bias control circuit 124 (discussed below). A first diode 125 is connected between I/O pin 140(1) and the output terminal of well bias control circuit 124. A second diode 126 is connected between I/O pin 140(1) and a global Vtt bus 150 that extends around a periphery of the FPGA on which I/O circuit 120(1) is located. A bipolar ESD circuit 127 is provided between I/O pin 140(1) and ground. Finally, input signals applied to I/O pin 140(1) are transmitted out of I/O circuit 120(1) on a DATA IN line via a buffer 128 comprised of serially-connected inverters.

I/O circuit 120(1) operates in two modes: an output mode in which I/O pin 140(1) is used for transmitting output signals from the PLD, and an input mode in which I/O pin 140(1) is used for receiving input signals from an external source, and passing the input signals to the internal portions of the PLD. In the output mode, output circuit 121 receives output signals from the internal portions of the PLD on the DATA OUT line, and drives pull-up transistor 122 and pull-down transistor 123 to generate appropriate high or low output signals on output pin 140(1). In the input mode, output circuit 121 is placed in a tristate mode, thereby disconnecting the DATA OUT line from I/O pin 140(1). This disconnection allows input signals to pass unimpeded from I/O pin 140(1) through buffer 128 and into the PLD on the DATA IN line.

A 3.3V PLD can safely drive its own I/O pin when the I/O pin is being used for output. However, when the I/O pin of a 3.3V PLD is being driven by a neighboring 5V device (i.e., in the input mode), the 3.3V PLD must prevent the 5V signals from damaging the pull-up transistors of the I/O circuit. This damage control is accomplished in I/O circuit 120(1) using well bias control circuit 124 and diode 125, which connect the N-well of pull-up transistor 122 to Vcc (3.3V) during the output mode, and to I/O pin 140(1) in the input mode. Connecting the N-well to I/O pin 140(1) in the input mode allows input signals up to 5.5V input signals without creating a forward biased diode between the N-well of pull-up transistor 122 and Vcc, thereby preventing damage to the PLD.

In addition, I/O circuit 120(1) includes diode 126 that is connected between I/O pin 140(1) and a global Vtt bus 150 when PCI compliance is required. When the PLD is to be 5V tolerant, Vtt bus is left floating. When PCI compliance is desired, the Vtt bus is bonded via connection 160 to a special Vtt pad 170 that is tied to the 3.3V power supply. This connection protects the PLD by limiting the maximum voltage at I/O pin 140(1) that is common to the low and high voltage devices. When an external voltage is applied to I/O pin 140(1) that is sufficiently greater than the power supply voltage, diode 126 turns on and draws current.

A problem with I/O circuit 120(1) is that Vtt bus 150 takes up a significant amount of area, and typically must be bonded to several pins that could otherwise be used for I/O purposes. Vtt bus 150 extends around the entire periphery of a PLD, and must be wide enough to carry the significant currents that can be generated when PCI compliance is desired. Therefore, Vtt bus 150 takes up a significant amount of area that could otherwise be used for logic circuits. In addition, Vtt bus 150 must be bonded to several (e.g., eight or more) I/O pins located around the PLD to assure that all sections of Vtt bus 150 are maintained at 3.3V. Therefore, when PCI compliance is required, fewer I/O pins are available for I/O functions, thereby limiting the logic operation that can be implemented on the PLD.

What is needed is an improved low voltage I/O circuit with a high voltage tolerance that avoids the above-mentioned problems associated with the prior art I/O circuits.

SUMMARY OF THE INVENTION

The present invention is directed to a programmable input/output (I/O) circuit in which the I/O terminal pull-up transistor is tied to Vcc during PCI compliant input mode operation, thereby clamping the I/O terminal to Vcc without the use of the Vtt bus and associated diodes that are required by prior art I/O circuits. The I/O circuit is also programmable to isolate the pull-up transistor during 5V tolerant input mode operation by tying the pull-up transistor to the I/O terminal, thereby preventing a current path from the I/O terminal to Vcc. In an output mode, the I/O circuit allows the pull-up transistor to pull up the I/O terminal to Vcc in response to a pull-up data signal.

In a disclosed embodiment, an isolation transistor connected between the pull-up transistor and the I/O terminal. A gate bias control circuit is connected between Vcc and the gate of the isolation transistor, and is controlled by a bias control signal. A well bias control circuit is connected between Vcc and the bulk terminals of the pull-up transistor and the isolation transistor, and is also controlled by the bias control signal.

When 5V tolerant input mode operation is desired, the gate of the isolation transistor is connected to the I/O terminal, and the bulk terminals of the pull-up and isolation transistors are connected to the I/O terminal, thereby isolating the pull-up transistor from high (up to 5.5 volt) signals on the I/O terminal.

When PCI compliant input mode operation is desired, the gate bias control circuit connects the gate of the isolation transistor to Vcc and the well bias control circuit connects the bulk terminals of the pull-up transistor and the isolation transistor to Vcc. When the gate of the pull-up transistor is turned on, a current path is provided through the isolation transistor and the pull-up transistor that clamps the I/O terminal to Vcc in accordance with PCI specifications.

Also in accordance with the first embodiment, the pull-up transistor and the isolation transistor are PMOS transistors that are formed in a common N-well. This allows the well bias control circuit to bias the wells of these transistors to the I/O terminal voltage, thereby preventing damage by high (up to 5.5 volt) input signals.

In accordance with another aspect of the present invention, the programmable I/O circuit includes an impedance control circuit including three pre-driver buffers. The first pre-driver buffer transmits a pull-up data signal to the pull-up transistor in response to a device output signal when the I/O circuit is in an output mode. Similarly, the second pre-driver buffer generates a pull-down data signal in response to the data output signal when the I/O circuit is in the output mode. The third pre-driver buffer turns off the pull-up transistor in the 5V tolerant input mode, and turns on the pull-up transistor in the PCI compliant input mode to provide the current path between the I/O terminal and Vcc in accordance with PCI specifications.

BRIEF DESCRIPTION OF THE DRAWINGS

FIGS. 6(A) and 6(B) are circuit diagrams showing a portion of an isolation circuit of the I/O circuit shown in FIG. 5.

DETAILED DESCRIPTION OF THE DRAWINGS

Figure 1:
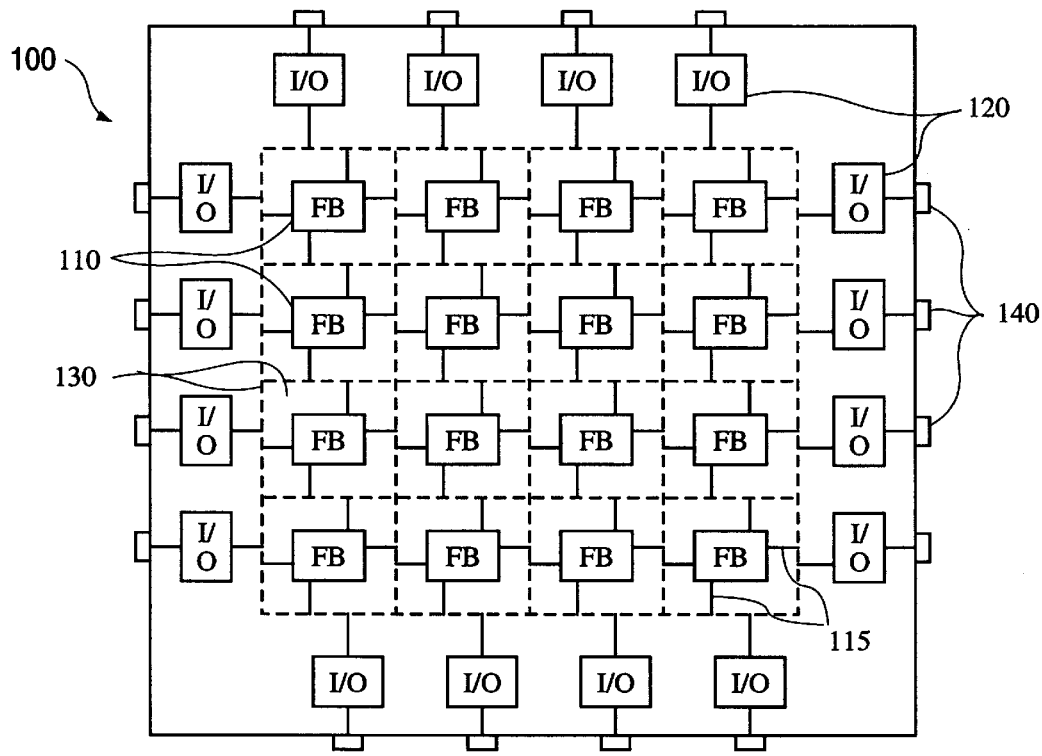
FIG. 1 is a simplified circuit diagram showing a field programmable gate array (FPGA) representing one type of programmable logic device (PLD).
Figure 2:
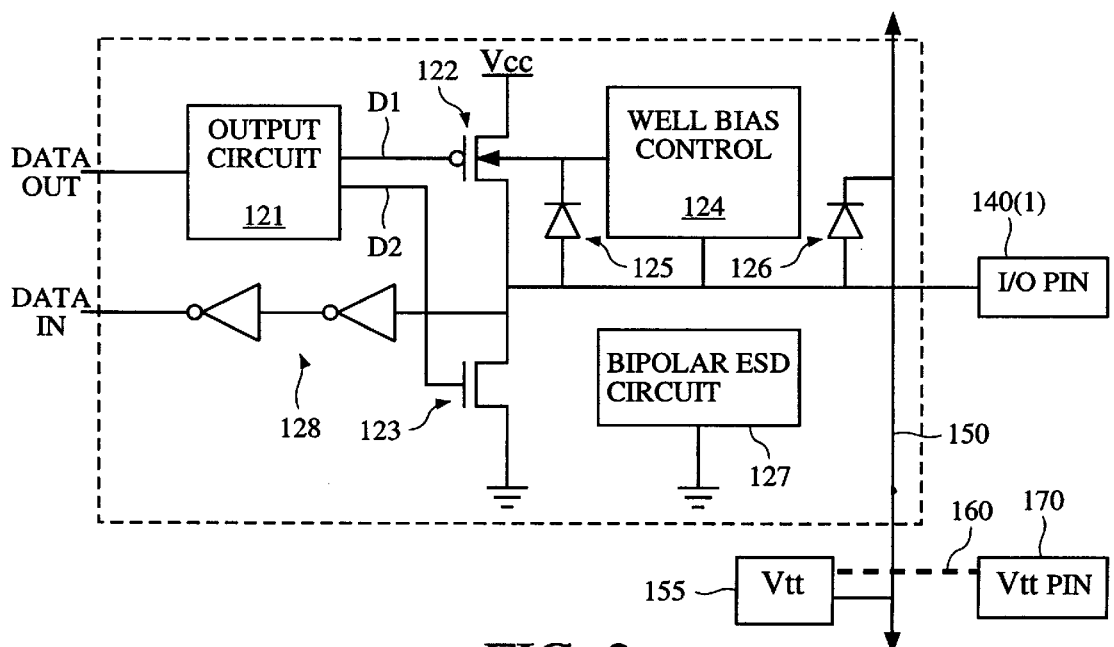
FIG. 2 is a diagram showing a portion of a prior art I/O circuit used in known PLDs.

The present invention is directed to a programmable I/O circuit that is utilized in integrated circuit (IC) devices, and in particular in programmable logic devices (PLDs), such as FPGA 100 (see FIG. 1). Although the I/O circuit is described below with reference to FPGAs, the I/O circuit may be beneficially utilized in other types of PLDs and ICs. Therefore, the appended claims should not be limited to FPGA applications of the disclosed I/O circuit.

Figure 3:
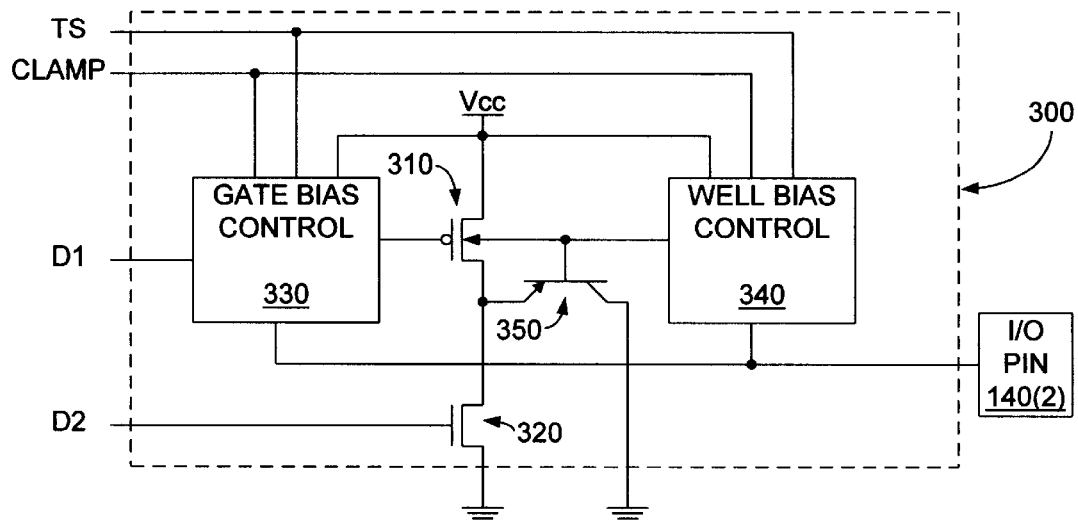
FIG. 3 is a simplified diagram showing an I/O circuit according to a first embodiment of the present invention.

FIG. 3 is a simplified diagram showing an I/O circuit 300 in accordance with a first embodiment of the present invention that can be used in a PLD, for example, in place of I/O circuit 120 in FPGA 100. I/O circuit 300 includes a P-channel pull-up transistor 310, an N-channel pull-down transistor 320, a gate bias control circuit 330, and a well bias control circuit 340. Pull-up transistor 310 has a first terminal connected to Vcc (first voltage source), a second terminal connected to I/O pin 140(2) (I/O terminal), a gate that is controlled by gate bias control circuit 330, and an N-well body (bulk terminal) connected to well bias control circuit 340. Pull-down transistor 320 has a first terminal connected to I/O pin 140(2), a second terminal connected to ground (second voltage source), a gate that is driven by a pull-down control signal D2, and a body (bulk terminal) that is connected to ground. Gate bias control circuit 330 selectively connects the gate of pull-up transistor 310 to I/O pin 140(2), to Vcc, or to data line D1 in response to a tristate ("TS") (first) mode control signal and a CLAMP (second) mode control signal. Well bias control circuit 340 selectively connects the N-well of pull-up transistor 310 either to I/O pin 140(2) or to Vcc in response to the TS and CLAMP mode control signals.

I/O circuit 300 is programmable via the TS and CLAMP mode control signals to operate in a PCI compliant (first)

input mode, a 5V tolerant (second) input mode, or an output mode. In the PCI compliant input mode, gate bias control circuit 330 ties the gate of pull-up transistor 310 to Vcc, and well bias control circuit 340 ties the N-well of pull-up transistor 310 to Vcc. In the 5V tolerant input mode, gate bias control circuit 330 ties the gate of pull-up transistor 310 to I/O pin 140(2), and well bias control circuit 340 ties the N-well of pull-up transistor 310 to I/O pin 140(2). In the output mode, gate bias control circuit 330 allows pull-up transistor 310 to drive I/O pin 140(2) in response to data signals transmitted on data line D1, and well bias control circuit 340 is biased to Vcc.

Because the N-well of pull-up transistor 310 is connected to I/O pin 140(2) during the 5V tolerant input mode, input signals up to 5.5V can be applied to I/O pin 140(2) without creating a forward-biased diode between the N-well of pull-up transistor 310 and Vcc, thereby preventing damage to the PLD.

Further, both 5V tolerance and PCI tolerance are achieved without the use of the Vtt diode 126 and the special Vtt bus and associated circuitry required in prior art I/O circuit 120(1), thereby providing more area for logic circuitry and more I/O pins during PCI compliant input mode operation.

In accordance with an optional embodiment of the present invention, I/O circuit 300 further includes a parasitic bipolar transistor 350 connected between the second terminal of pull-up transistor 310 and ground that has a gate tied to the N-well of pull-up transistor 310. Parasitic bipolar transistor 350 is formed, for example, by providing a P-type diffusion in the N-well of pull-up transistor 310 that is connected to the second terminal of pull-up transistor 310. When high voltages are applied to I/O pin 140(2) during PCI compliant input mode operation, the diode formed by the P-type diffusion turns on parasitic bipolar transistor 310, thereby drawing some of the current to ground. If the gain of parasitic bipolar transistor 310 is approximately 2 or more, then the amount of current drawn to ground significantly reduces the voltage across the transistors of well bias control circuit 340, thereby allowing these transistors to be smaller. However, the presence of parasitic bipolar transistor 310 may increase the risk of latch-up.

Figure 4:
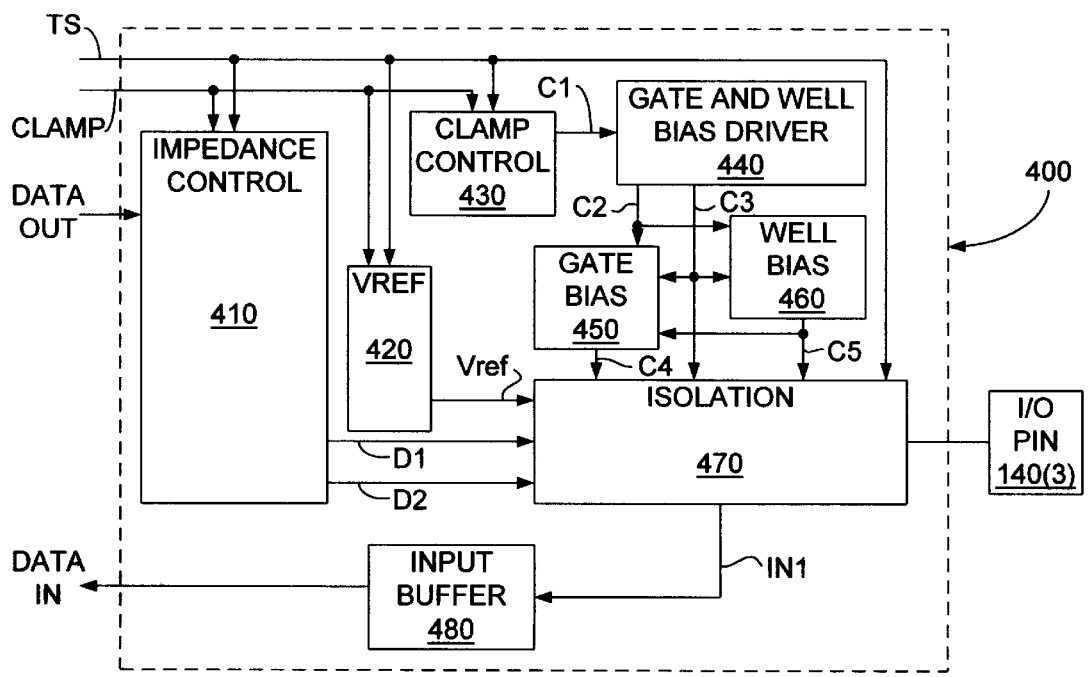
FIG. 4 is a block diagram showing an I/O circuit according to a second embodiment of the present invention.

FIG. 4 is a block diagram showing an I/O circuit 400 in accordance with a second embodiment of the present invention. I/O circuit 400 receives PLD data output signal DATA OUT and control signals TS and CLAMP from the internal portions (e.g., FBs and/or global bus lines) of the PLD (not shown) upon which I/O circuit 400 is formed. I/O circuit 400 includes an impedance control circuit 410, a reference voltage (VREF) circuit 420, a clamp control circuit 430, a gate and well bias driver circuit 440, a gate bias control circuit 450, a well bias control circuit 460, an isolation circuit 470 and an input buffer 480. Impedance control circuit 410 receives the DATA OUT signal and the TS and CLAMP mode control signals, and generates pull-up data signal D1 and pull-down data signal D2. VREF circuit 420 receives the TS and CLAMP mode control signals, and generates an intermediate reference voltage Vref. Clamp control circuit 430 also receives the TS and CLAMP mode control signals, and generates a first control signal C1. Gate and well bias driver circuit 440 receives the first control signal C1, and generates a second control signal C2 and a third control signal C3. The control signals C2 and C3 are transmitted to gate bias control circuit 450 and well bias control circuit 460. Gate bias control circuit 450 generates a gate control signal C4 that is transmitted to isolation circuit 470. Well bias control circuit 460 generates a well control signal C5 that is transmitted to gate bias control circuit 450 and isolation circuit 470. Isolation circuit 470 shifts between a PCI compliance input mode, a 5V tolerance input mode and an output mode in response to the TS, C3, C4 and C5 control signals. In the output mode, pull-up and pull-down transistors (not shown) of isolation circuit 470 respectively apply high and low output signals to I/O pin 140(3) in response to the pull-up data signal D1 and the pull-down data signal D2 received from impedance control circuit 410. In the PCI compliance input mode, gate bias control circuit 450 and well bias control circuit 460 generate control signals C4 and C5 that tie the gate and well of the pull-up transistor of isolation circuit 470 to Vcc (e.g., 3.3V). In the 5V tolerance input mode, gate bias control circuit 450 and well bias control circuit 460 generate control signals C4 and C5 that connect the gate and well of the pull-up transistor of isolation circuit 470 to I/O pin 140(3). In both the PCI compliance input mode and the 5V tolerance input mode, input signals IN1 that are received on I/O pin 140(3) are transmitted through isolation circuit 470 and input buffer 480 to the DATA IN line for transmission to an internal portion (e.g., an FB) of the PLD.

The individual circuits of I/O circuit 400 will now be described in additional detail with reference to FIG. 5.

Impedance Control Circuit 410

Figure 5:
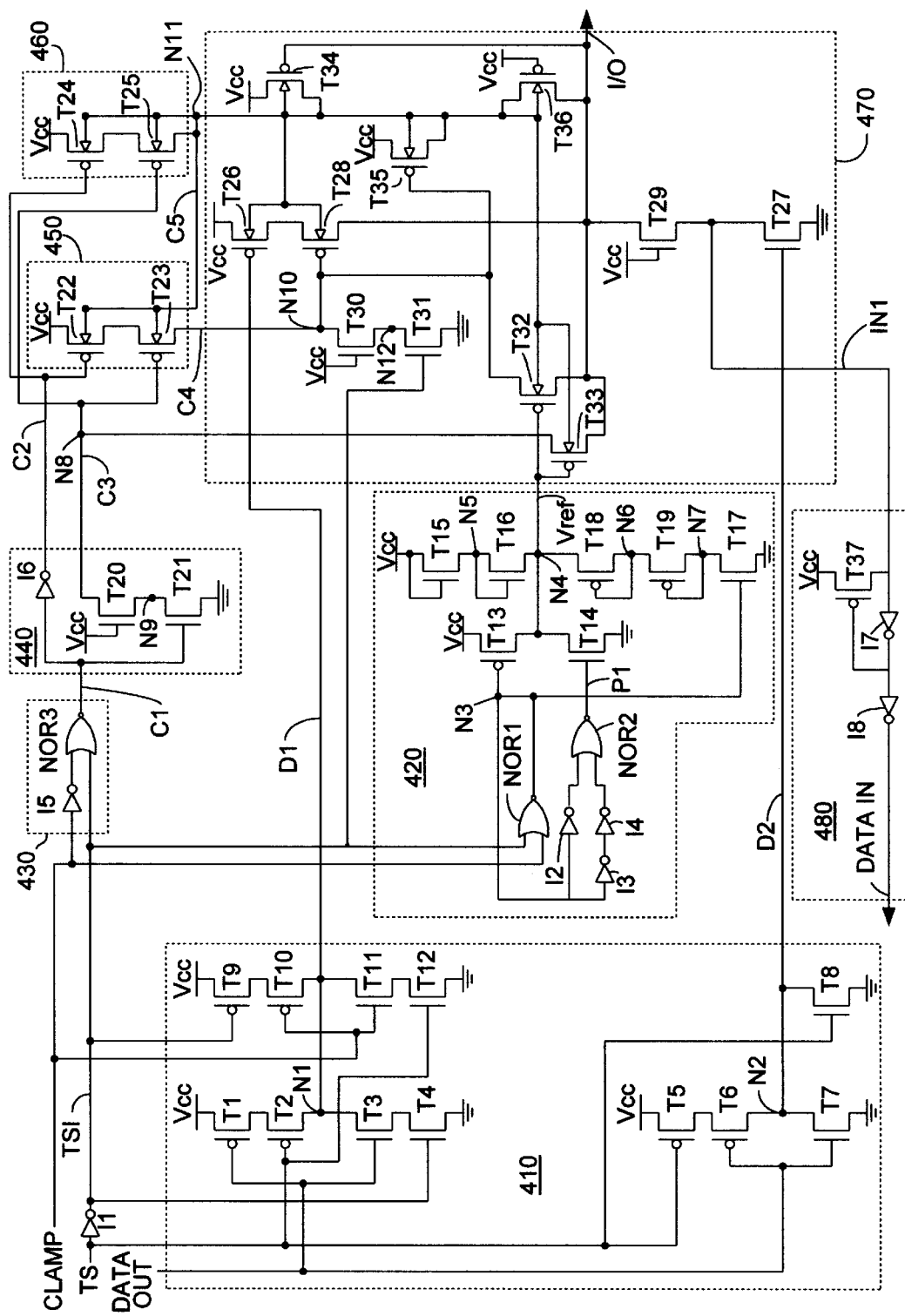
FIG. 5 is a circuit diagram showing the I/O circuit of FIG. 4 in additional detail.

Referring to FIG. 5, impedance control circuit 410 includes a first pre-driver buffer for generating pull-up data signal D1 during the output mode, a second pre-driver buffer for generating pull-down data signal D2 during the output mode, and a third pre-driver buffer for generating a high (Vcc) signal on pull-up data line D1 during the 5V tolerant input mode and an low signal during the PCI compliant input mode. The TS mode control signal is provided in a non-inverted form and in an inverted (TSI) form (via inverter I1) to impedance control circuit 410. The first pre-driver buffer includes PMOS transistors T1 and T2 that are connected in series between Vcc and a first node N1, and NMOS transistors T3 and T4 that are connected in series between node N1 and ground. Transistors T1 and T3 are controlled by the signal on the DATA OUT line, transistor T2 is controlled by the TS mode control signal, and transistor T4 is controlled by the TSI mode control signal. The second pre-driver buffer includes PMOS transistors T5 and T6 that are connected in series between Vcc and a second node N2, and NMOS transistor T7 that is connected between node N2 and ground. Transistors T6 and T7 are controlled by the signal on the DATA OUT line, and transistor T5 is controlled by the TS mode control signal. The second pre-driver buffer also includes NMOS transistor T8 that is connected between node N2 and ground, and is controlled by the TS mode control signal. The third pre-driver buffer includes PMOS transistors T9 and T10 that are connected in series between Vcc and first node N1, and NMOS transistors T11 and T12 that are connected in series between node N1 and ground. Transistors T10 and T11 are controlled by the CLAMP mode control signal, transistor T9 is controlled by the TSI mode control signal, and transistor T12 is controlled by the TS mode control signal.

During output mode operation, the first and second pre-driver buffers are activated such that they are responsive to the data signals received on the DATA OUT line, and the third pre-driver buffer circuit is deactivated. Specifically, when control signal TS is low, transistors T2 and T4 of the first pre-driver buffer are turned on, so that the signal on the DATA OUT line alternatively connects node N1 to Vcc or ground. In addition, transistor T5 of the second pre-driver buffer is turned on, so that the signal on the DATA OUT line alternatively connects node N2 to Vcc or ground. As discussed below, these high and low voltages on nodes N1 and N2 generate data signals D1 and D2 that are applied to a PMOS pull-up transistor and an NMOS pull-down transistor of isolation circuit 470. Note that the third pre-driver buffer is de-activated by the low TS mode control signal applied to NMOS transistor T12 and the high TSI mode control signal applied to PMOS transistor T9.

During both PCI compliant input mode operation and 5V tolerant input mode operation, the first and second pre-driver buffers are de-activated (tristated) by the high TS mode control signal. Specifically, the high TS signal turns off transistors T2 and T4 of the first pre-driver buffer and transistor T5 of the second pre-driver buffer so that the nodes N1 and N2 are not changed by the signals on the DATA OUT line. In addition, the high TS signal turns on transistor T8, thereby pulling the pull-down line D2 low.

The third pre-driver buffer generates a low voltage signal at node N1 when I/O circuit 400 is in the PCI compliant input mode, and a high (Vcc) signal on node N1 when I/O circuit 400 is in the 5V tolerant input mode. Specifically, when the TS signal is high, transistors T9 and T12 (via TSI) are turned on. Therefore, when the CLAMP control signal is high (indicating PCI compliant input mode operation), transistor T10 is turned off and transistor T11 is turned on, thereby grounding node N1 and generating a low voltage signal on D1. Alternatively, in 5V tolerant mode operation (CLAMP is low), transistor T10 is turned on and transistor T11 is turned off, thereby connecting node N2 to Vcc.

Reference Voltage Circuit 420

Reference voltage (VREF) circuit 420 provides an intermediate voltage Vref to protect isolation circuit 470. VREF circuit 420 includes a first NOR gate NOR1 that receives the CLAMP and TSI mode control signals. NOR gate NOR1 generates an output signal on node N3 that is applied to the gate of PMOS transistor T13 and to NMOS transistor T17, and also the NMOS transistor T14 through a one-shot pulse generator formed by inverters I2, I3 and I4 and NOR gate NOR2. Transistor T13 is connected between Vcc and a node N4, and transistor T14 is connected between node N4 and ground. Node N4 is also connected to a transistor stack formed by NMOS transistors T15 and T16 and 17, and PMOS transistors T18 and T19. Transistor T15 is connected between Vcc and a node N5 (which is located between transistors T15 and T16), and has a gate that is connected to Vcc. Transistor T16 is connected between node N5 and node N4, and has a gate that is connected to node N5. Transistor T18 is connected between node N4 and a node N6 (which is located between transistors T18 and T19), and has a gate that is connected to node N6. Transistor T19 is connected between node N6 and a node N7 (which is located between transistors T17 and T19), and has a gate that is connected to node N7. Finally, transistor T17 is connected between node N7 and ground, and has a gate connected to node N3.

During output mode operation, TSI signal is high, so NOR gate NOR1 generates a low signal that turns on transistor T13 and turns off transistor T17, thereby pulling node N4 to a high voltage such that Vref is equal to Vcc.

Similarly, during PCI compliant input mode operation, CLAMP is high, so NOR gate NOR1 generates a low signal that turns on transistor T13 and turns off transistor T17, thereby pulling node N4 to a high voltage such that Vref is equal to Vcc.

During 5V tolerant input mode operation, both TSI and CLAMP are at a low logic level, thereby causing NOR gate NOR1 to generate a high output signal on node N3. Under steady state conditions, when node N3 is at a high logic level, PMOS transistor T13 is off and NMOS transistor T17 is on. When transistor T17 is on, the transistor stack including transistors T15, T16, T17, T18 and T19, is enabled and sets the reference voltage at node N3. Because the gates of transistors T15, T16, T18 and T19 are coupled to their drains, these transistors are always on and each provides a threshold voltage drop. Therefore, when transistor T17 is on, the reference voltage on node N4 is approximately Vcc/2.

The one-shot pulse generator formed by inverters I2, I3 and I4, and NOR gate NOR2 improves the recovery time of the circuit when switching from output mode operation to 5V tolerant input mode operation. The one-shot pulse generator responds to the high-going signal on node N3. The one-shot circuit includes transistor T14 that is briefly turned on by the high signal P1 from NOR gate NOR2 that exists only when inverters I2 and I3 have switched and inverter I4 has not yet switched. Transistor T14 briefly pulls down Vref, which, as explained below, briefly applies the voltage on I/O pin 140(3) to the isolation circuit 470. Transistors T15, T16, T18 and T19 are preferably weak transistors in order to minimize current flow from Vcc to ground during input mode operation. Therefore, when transistor T17 is turned on, transistors T18 and T19 will pull node N4 from Vcc to Vcc/2 relatively slowly. Using transistor T14 to pull down node N4 reduces the turn-on time of PMOS transistors in the isolation circuit (discussed below). The one-shot circuit pulls node N4 low momentarily. This pull down must not be a steady state condition because the I/O pin voltage may be 5.5 volts and the ground voltage supplied by transistor T14 is 0 volts. This 5.5-volt difference can destroy the thin oxide of the PMOS transistors used in isolation circuit 470. After a brief period, the voltage at node N4 is pulled to approximately Vcc/2 by the transistor stack.

Clamp Control Circuit 430

Clamp control circuit 430 includes an inverter I5 and a two-input NOR gate NOR3. Inverter I5 inverts the CLAMP control signal and is connected to one input of NOR gate NOR3. The TSI mode control signal is applied to the second input terminal of NOR gate NOR3. NOR gate NOR3 generates a high output signal only in the PCI compliant input mode (both TS and CLAMP are high). In all other modes, NOR gate NOR3 generates a low output signal. The output signal from NOR gate NOR3 provides the first control signal C1 from clamp control circuit 430.

Gate and Well Bias Driver Circuit 440

Gate and well bias driver circuit 440 includes an inverter I6 and NMOS transistor T20 and T21. Inverter I6 receives control signal C1 and outputs control signal C2. Transistor T20 is connected between a node N8 and a node N9 (node N9 is located between transistors T20 and T21), and has a gate tied to Vcc. Transistor T21 is connected between node N9 and ground, and has a gate that is controlled by control signal C1.

During output mode operation mode operation (C1 is low), inverter I6 generates a high C2 control signal, and transistor T21 is turned off (i.e., node N8 is not connected to ground through transistors T20 and T21), so control signal C3 is floating.

Similarly, during 5V tolerant input mode operation (C1 is low), inverter I6 generates a high C2 control signal, and transistor T21 is turned off (i.e., node N8 is not connected to ground through transistors T20 and T21). However, unlike output mode operation, node N8 is connected to the input pin during 5V tolerant input mode operation through isolation circuit 470 (discussed below). Therefore, the control signal C3 (the voltage at node N8) is controlled by the signal applied to the input pin.

During PCI compliant input mode operation (C1 is high), inverter I6 generates a low C2 control signal, and transistor T21 is turned on, thereby generating a low C3 control signal.

Gate Bias Control Circuit 450

Gate bias control circuit 450 includes PMOS transistor T22 and T23 that are connected in series between Vcc and a node N10. Transistor T22 is connected between Vcc and transistor T23, and has a gate controlled by control signal C2. Transistor T23 is connected between transistor T22 and node N10, and has a gate that is controlled by control signal C3. Both transistors T22 and T23 are formed in an N-well that is connected to a node N11.

During both output mode operation and 5V tolerant input mode operation (signal C2 is high), transistor T22 is turned off. Therefore, node N10 cannot be pulled up to Vcc in either of these modes even if control signal C3 were low. Further, during 5V tolerant input mode operation, the gate of transistor T23 is connected to the input pin, thereby isolating Vcc from high voltage signals on node N10 that are transmitted from the input pin.

During PCI compliant input mode operation, transistor T22 is turned on by the low C2 control signal. In addition, the low C3 control signal turns on transistor T23, thereby connecting node N10 to Vcc and causing gate bias control circuit 450 to generate a high C4 control signal.

Well Bias Control Circuit 460

Well bias control circuit 460 includes PMOS transistor T24 and T25 that are connected in series between Vcc and node N11. Transistor T24 is connected between Vcc and transistor T25, and has a gate controlled by control signal C2. Transistor T25 is connected between transistor T24 and node N11, and has a gate that is controlled by control signal C3. Both transistors T24 and T25 are formed in an N-well that is connected to node N11.

During both output mode operation and 5V tolerant input mode operation (signal C2 is high), transistor T24 is turned off. Therefore, node N11 cannot be pulled up to Vcc in either of these modes even if control signal C3 were low.

During PCI compliant input mode operation, transistor T24 is turned on by the low C2 control signal. In addition, the low C3 control signal turns on transistor T25, thereby connecting node N11 to Vcc and causing well bias control circuit 460 to generate a high C5 control signal.

Isolation Circuit 470

Isolation circuit 470 includes a PMOS pull-up transistor T26 and an NMOS pull-down transistor T27 that are respectively controlled by pull-up data signal D1 and pull-down data signal D2. In addition, a PMOS isolation transistor T28 is connected between pull-up transistor T26 and the I/O pin, and an NMOS isolation transistor T29 is connected between pull-down transistor T27 and the I/O pin. Isolation transistor T29 has a gate tied to Vcc. Isolation transistor T28 has a gate connected to node N10 and is controlled by control signal C4. Both pull-up transistor T26 and isolation transistor T28 are formed in an N-well that is connected to node N11.

Node N10 is connected to ground through series-connected NMOS transistors T30 and T31, with transistor T30 connected between node N10 and a node N12, and transistor T31 connected between node N12 and ground. The gate of transistor T30 is connected to Vcc, and the gate of transistor T31 is controlled by the TSI mode control signal. Node N10 is further connected to the I/O pin through a PMOS transistor T32 whose gate is connected to reference voltage Vref (output from VREF circuit 420) and is formed in an N-well that is connected to node N11. Vref is also applied to the gate of PMOS transistor T33 which is connected between node N8 and the I/O pin, and is formed in an N-well that is also connected to node N11.

Node N11 is also connected to the source and N-well of PMOS transistor T34, whose gate is connected to the I/O pin and whose drain is connected to Vcc. Another PMOS transistor T35 is connected between Vcc and node N11, and has a gate connected to node N10 and is formed in an N-well connected to node N11. Finally, another PMOS transistor T36 is connected between node N11 and the I/O pin, and has a gate connected to Vcc and is formed in an N-well also connected to node N11.

During output mode operation (TS is low), a high TSI mode control signal is applied to the gate of transistor T31, thereby turning this transistor on and (because transistor T30 is also on) connecting node N10 to ground. The low voltage on node N10 turns on isolation transistor T28, thereby providing an unimpeded connection between pull-up transistor T26 and the I/O terminal. Note that because of the low TS control signal, gate and well bias driver circuit 440 generates a high control signal C2 and floats control signal C3 (thus, node N8 is floating). The low signal on node N10 turns on transistor T35, thereby pulling node N11 to Vcc. With the N-well of pull-up transistor T26 tied to Vcc (via node N11), the I/O terminal is pulled up to Vcc each time the pull-up signal D1 is low. Conversely, a high pull-down signal D2 turns on pull-down transistor T27, thereby connecting the I/O terminal to ground (through the turned-on isolation transistor T29).

The isolation transistors T28 and T29 are provided to protect the pull-up transistor T26 and pull-down transistor T27 during the input modes.

The operation of isolation transistor T29 is the same in either the 5V tolerant input mode operation or the PCI compliant input mode operation. Transistor T29 has its gate connected to Vcc (3.3 volts) and thus the voltage at the source of T29 (at line IN1) is no more than Vcc minus one NMOS threshold drop (or about 3.3−0.7=2.6 volts). Therefore, neither pull-down transistor T27 nor inverter I7 (in input buffer circuit 480, discussed below) experience damaging voltage levels during either input mode.

The operation of isolation transistor T28 is more complex in that it changes in accordance with the selected input mode. During 5V tolerant input mode operation, isolation transistor T28 must protect pull-up transistor T26 from up to 5.5 volt signals received by the I/O pin. To meet this requirement, both the gate and the N-well of isolation transistor T28 are connected to the I/O pin, thereby turning off isolation transistor T28 even if the I/O pin is raised to 5.5 volts. In contrast, during PCI compliant input mode operation, the input pin must be clamped to Vcc. To accomplish this, the gate and well of isolation transistor T28 must be connected to Vcc. As discussed above, the gate of pull-up transistor T26 is turned on by the third pre-driver buffer of impedance control circuit 410, which generates a low pull-up data signal D1 to the gate of PMOS pull-up transistor T26. The gate bias of isolation transistor T28 is connected to Vcc by gate bias control circuit 450, which generates a high (Vcc) control signal C4 in the PCI compliant input mode. Finally, the well bias of pull-up transistor T26 and isolation transistor T28 is raised to Vcc by well bias control circuit 460, which connects the wells of these transistors to Vcc during PCI compliant input mode operation.

FIGS. 6(A) and 6(B) show portions of isolation circuit 470 during 5V tolerant input mode operation and PCI compliance input mode operation, respectively.

Referring to FIG. 6(A), during 5V tolerant input mode operation data signal D1 is high and data signal D2 is low, thereby turning off pull-up transistor T26 and pull-down transistor T27. In addition, reference voltage Vref is maintained at Vcc/2, thereby turning on transistors T32 and T33 and connecting control signal C3 (node N8 in FIG. 5) and C4

(node N10 in FIG. 5) to the I/O pin. In other words, when a high (e.g., 5 volt) input signal is applied to the I/O pin, C3 and C4 are raised to that high voltage level through transistors T32 and T33. As discussed above, the high C3 control signal is applied to the gate of transistor T23 of gate bias control circuit 450. The high C4 control signal is applied to the gate of isolation transistor T28. Further, because the gate of transistor T36 is tied to Vcc, a high (5 volt) input signal on the I/O pin turns on transistor T36 and raises control signal C5 (node N11) to that high input signal. With control signals C4 and C5 tied to the I/O pin, the gate, N-well and source of isolation transistor T28 are raised to the same high I/O pin level, thereby preventing a current path from the I/O pin to Vcc through pull-up transistor T26.

Referring to FIG. 6(B), during PCI compliant input mode operation, data signal D1 is low and data signal D2 is low, thereby turning on pull-up transistor T26 and turning off pull-down transistor T27. In addition, reference voltage Vref is maintained at Vcc, thereby turning off transistors T32 and T33. As discussed above with respect to gate and well bias driver circuit 440, gate bias control circuit 450 and well bias control circuit 460, control signals C3, C4 and C5 are low, Vcc and Vcc, respectively. Control signal C4 is applied to the gate of isolation transistor T28, and control signal C5 is applied to the N-well of isolation transistor T28, thereby causing transistor T28 to turn on only when the I/O pin is raised one P-channel threshold voltage above Vcc, thereby providing a current path through pull-up transistor T26 to Vcc in accordance with PCI specifications.

Input Buffer Circuit 480

Turning back to FIG. 5, input buffer circuit 480 receives the IN1 output signal from isolation circuit 470 and includes series connected inverters I7 and I8 and a PMOS pull-up transistor T37. Pull-up transistor T37 has a gate that is connected to a node located between inverters I7 and I8, a drain connected to Vcc and a source connected to the input terminal of inverter I7. When the I/O pin voltage is low (0 volts), the signal IN1 supplied from isolation circuit 470 is inverted by inverters I7 and I8. Conversely, a signal IN1 that is 2.6 volts or greater, inverter I7 generates a low output signal that turns on pull-up transistor T37, thereby raising the voltage level at the input terminal of inverter I7 to Vcc to avoid DC current flow through inverter I7. The size of transistor T37 is selected so that a switching I/O signal overrides the Vcc level at the input terminal of inverter I7. Inverter I8 provides further buffering and transmits signals on the DATA IN line to internal portions of the PLD upon which I/O circuit 400 is formed that are the same polarity as the IN1 signal.

The I/O interface circuit of the present invention can be fabricated using both NMOS and PMOS transistors having a single turn-on threshold voltage, thereby reducing the cost of fabrication of the present invention over prior art circuits that require NMOS and PMOS transistors having different turn-on threshold voltages. While the figures show an N-well technology embodiment, it is understood that the present invention can also be created using other technologies, for example, a dual-well technology.

Although the present invention has been described with respect to certain specific embodiments, it will be clear to those skilled in the art that the inventive features of the present invention are applicable to other embodiments as well, all of which are intended to fall within the scope of the present invention.

I claim:

1. A programmable input/output (I/O) circuit for transmitting output signals on or receiving input signals from an I/O terminal, the I/O circuit comprising:

a pull-up transistor connected between a system voltage source and the I/O terminal, the pull-up transistor having a gate and a bulk terminal;

a gate bias control circuit connected between the system voltage source and the I/O terminal, the gate bias control circuit having an output terminal connected to the gate of the pull-up transistor and an input terminal for receiving a mode control signal;

a well bias control circuit connected to the system voltage source, the well bias control circuit having an output terminal connected to the bulk terminal of the pull-up transistor and an input terminal for receiving the mode control signal, wherein the gate bias control circuit connects the gate of the pull-up transistor to the I/O terminal and the well bias control circuit connects the bulk terminal of the pull-up transistor to the I/O terminal when the mode control signal indicates a first operating mode, and wherein the gate bias control circuit connects the gate of the pull-up transistor to the system voltage source and the well bias control circuit connects the bulk terminal of the pull-up transistor to the system voltage source when the mode control signal indicates a second operating mode.

2. The programmable I/O circuit according to claim 1, wherein the pull-up transistor is a PMOS transistor and the bulk terminal is formed in an N-well.

3. The programmable I/O circuit according to claim 1, further comprising an NMOS pull-down transistor connected between the I/O terminal and ground.

4. A programmable input/output (I/O) circuit for transmitting output signals on or receiving input signals from an I/O terminal, the I/O circuit comprising:

a pull-up transistor having a first terminal connected to a system voltage source;

an isolation transistor having a first terminal connected to a second terminal of the pull-up transistor, and a second terminal connected to the I/O terminal, wherein a bulk terminal of the isolation transistor is connected to a bulk terminal of the pull-up transistor;

a first I/O transistor connected between a gate of the isolation transistor and the I/O terminal;

a second I/O transistor connected between the I/O terminal and the bulk terminals of the pull-up transistor and the isolation transistor;

a gate bias control circuit connected between the system voltage source and the gate of the isolation, and having an input terminal for receiving a first control signal; and a well bias control circuit connected between the system voltage source and the bulk terminals of the pull-up transistor and the isolation transistor, and having an input terminal for receiving the first control signal;

wherein the first I/O transistor connects the gate of the isolation transistor to the I/O terminal and the second I/O transistor connects the first and second bulk terminals to the I/O terminal when the I/O circuit is in a first operating mode; and wherein the gate bias control circuit connects the gate of the pull-up transistor to the system voltage source and the well bias control circuit connects the bulk terminals of the pull-up transistor and the isolation transistor to the system voltage source in response to the first control signal when the I/O circuit is in a second operating mode.

5. The programmable I/O circuit according to claim 4, wherein all of the pull-up transistor, the isolation transistor, the first I/O transistor and the second I/O transistor are PMOS transistors, and the bulk terminals of the pull-up transistor, the isolation transistor the first I/O transistor and the second I/O transistor are formed in an N-well.

6. The programmable I/O circuit according to claim 4, further comprising an NMOS pull-down transistor having a first terminal connected to ground, and an NMOS isolation transistor having a first terminal connected to a second terminal of the pull-down transistor, a second terminal connected to the I/O terminal, and a gate connected to the system voltage source.

7. The programmable I/O circuit according to claim 4, wherein the gate bias control circuit comprises a first PMOS transistor having a first terminal connected to the system voltage source, and a second PMOS transistor having a first terminal connected to a second terminal of the first PMOS transistor and a second terminal connected to the gate of the isolation transistor, wherein the first and second PMOS transistor are formed in an N-well that is connected to the bulk terminals of the pull-up transistor and the isolation transistor.

8. The programmable I/O circuit according to claim 7, wherein the well bias control circuit comprises a third PMOS transistor having a first terminal connected to the system voltage source, and a fourth PMOS transistor having a first terminal connected to a second terminal of the third PMOS transistor and a second terminal connected to the bulk terminals of the pull-up transistor and the isolation transistor, wherein the third and fourth PMOS transistor are formed in an N-well that is connected to the bulk terminals of the pull-up transistor and the isolation transistor.

9. The programmable I/O circuit according to claim 8, further comprising:
  a clamp control circuit for generating a second control signal in response to a first mode control signal and a second mode control signal;
  a gate and well bias driver circuit for generating the first control signal and a third control signal in response to the second control signal,
  wherein the first control signal is transmitted to the gate of the first PMOS transistor of the gate bias control circuit, and to the gate of the third PMOS transistor of the well bias control circuit, and
  wherein the second control signal is transmitted to the gate of the second PMOS transistor of the gate bias control circuit, and to the gate of the fourth PMOS transistor of the well bias control circuit.

10. The programmable I/O circuit according to claim 9, further comprising:
  a third I/O transistor connected between the I/O terminal and a node located on a path between the gate and well bias driver circuit and the gates of the second PMOS transistor and the fourth PMOS transistor, and
  wherein the third I/O transistor connects the gates of the second PMOS transistor and the fourth PMOS transistor the I/O terminal when the I/O circuit is in the first operating mode.

11. The programmable I/O circuit according to claim 10, further comprising:
  a reference voltage circuit for generating a reference voltage in response to the first mode control signal and the second mode control signal, wherein the reference voltage is transmitted to the gates of the first I/O transistor and the third I/O transistor; and
  wherein the reference voltage circuit maintains the reference voltage is at a first voltage level when the I/O circuit is in the first operating mode, thereby turning on the first and third I/O transistors in the first operating mode, and
  wherein the reference voltage circuit maintains the reference voltage at a second voltage level when the I/O circuit is in the second operating mode, thereby turning off the first and third I/O transistors in the second operating mode.

12. The programmable I/O circuit according to claim 4, further comprising an impedance control circuit including:
  a first pre-driver buffer for generating a pull-up data signal in response to a data signal and a first mode control signal when the I/O circuit is in a third operating mode, the pull-up data signal being transmitted to a gate of the pull-up transistor,
  a second pre-driver buffer for generating a pull-down data signal in response to the data signal and the first mode control signal when the I/O circuit is in the third operating mode, the pull-down data signal being transmitted to a gate of the pull-down transistor, and
  a third pre-driver buffer for transmitting a first signal to the gate of the pull-up transistor in response to the first mode control signal and a second mode control signal when the I/O circuit is in the first operating mode, thereby turning off the pull-up transistor, and for transmitting a second signal to the gate of the pull-up transistor in response to the first mode control signal and the second mode control signal when the I/O circuit is in the second operating mode, thereby turning on the pull-up transistor.

13. The programmable I/O circuit according to claim 4, further comprising a parasitic bipolar transistor connected between the second terminal of the pull-up transistor and ground, and having a gate connected to the bulk terminal of the pull-up transistor.

* * * * *